United States Patent [19]
Wakabayashi et al.

[11] Patent Number: 5,514,619
[45] Date of Patent: May 7, 1996

[54] METHOD OF PRODUCING A LASER DEVICE

[75] Inventors: Shinichi Wakabayashi; Hitomaro Tougou, both of Kawasaki; Yukio Toyoda, Tokyo, all of Japan

[73] Assignees: Matsushita Electric Industrial Co., Ltd., Osaka; Optoelectronics Technology Research Laboratory, Tokyo, both of Japan

[21] Appl. No.: 212,706

[22] Filed: Mar. 14, 1994

[30] Foreign Application Priority Data

Mar. 19, 1993 [JP] Japan .................................. 5-059935

[51] Int. Cl.⁶ .................................................. H01L 21/20
[52] U.S. Cl. .............................. 437/89; 437/90; 437/129
[58] Field of Search .............................. 437/89, 90, 129

[56] References Cited

U.S. PATENT DOCUMENTS

| | | | |
|---|---|---|---|
| 4,099,305 | 7/1978 | Cho et al. | 437/90 |
| 4,614,564 | 9/1986 | Sheldon et al. | 437/90 |
| 4,748,132 | 5/1988 | Fukuzawa et al. | |
| 4,788,159 | 11/1988 | Smith | 437/90 |
| 4,789,643 | 12/1988 | Kajikawa | 437/90 |
| 4,843,025 | 6/1989 | Morita | 437/89 |
| 4,974,036 | 11/1990 | Kapon . | |
| 5,138,625 | 8/1992 | Paoli et al. | |

FOREIGN PATENT DOCUMENTS

| | | | |
|---|---|---|---|
| 131525 | 6/1986 | Japan | 437/89 |
| 214618A | 9/1991 | Japan . | |
| 110066A | 4/1993 | Japan . | |

OTHER PUBLICATIONS

E. Kapon, et al, "Single Quantum Wire Semiconductor Lasers", Applied Physics Letters 55 (26) 25 Dec. 1989, pp. 2715–2717.

M. Walther, et al, "Carrier Capture and Quantum Confinement in GaAs/AlGaAs Quantum Wire Lasers Grown on V–Grooved Substrates", Applied Physics Letters 60 (5), 3 Feb. 1992, pp. 521–523.

Hitomaro Tougou et al; "Molecular Beam Epitaxial Regrowth On AlGaAs/GaAs Wire Structure"; Proceedings Of The International Symposium On Intelligent Design And Synthesis Of Electronic Material Systems; Osaka, Japan; Nov. 4–6, 1992; pp. 177–178.

*Primary Examiner*—Robert Kunemund
*Assistant Examiner*—Linda J. Fleck
*Attorney, Agent, or Firm*—Watson Cole Stevens Davis

[57] ABSTRACT

A semiconductor microstructure is formed by forming a groove having a surface of a side wall and a surface of a bottom, and depositing a semiconductor layer in the groove so that a width of the semiconductor layer is defined by the surface of the side wall.

9 Claims, 10 Drawing Sheets

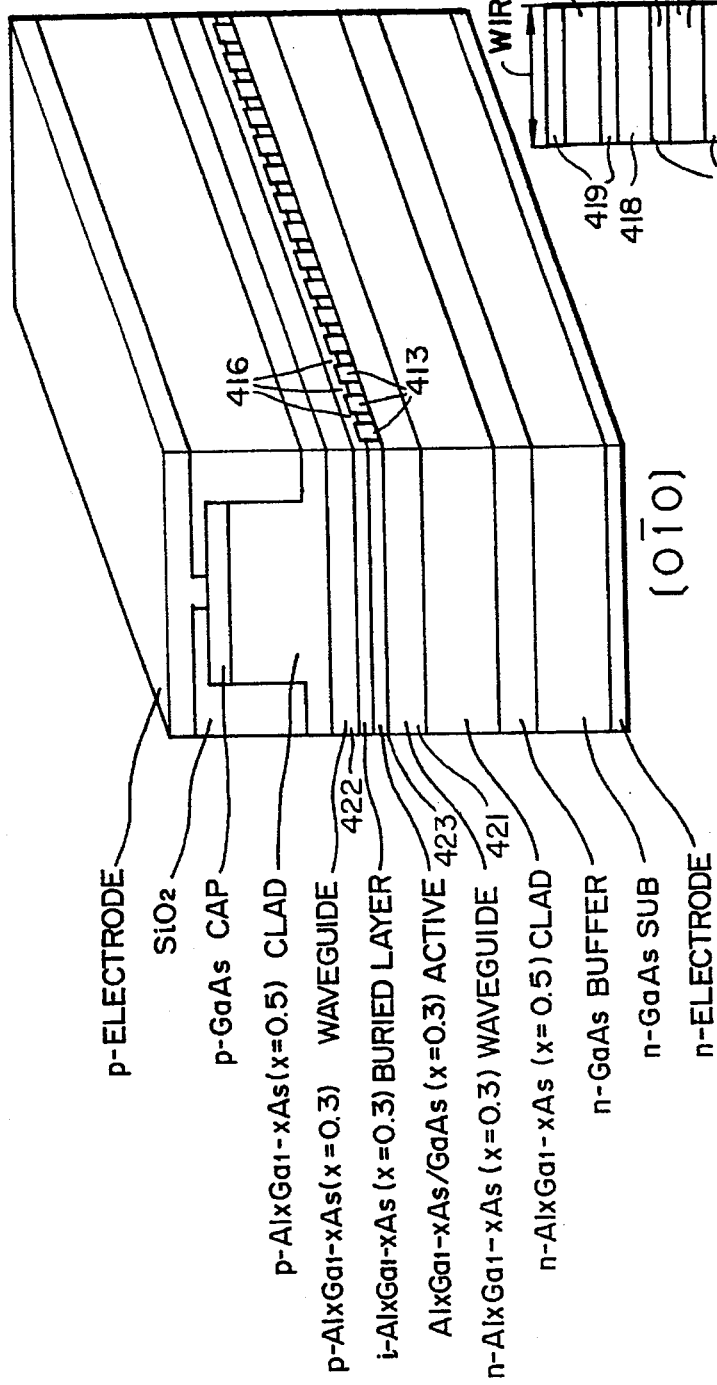
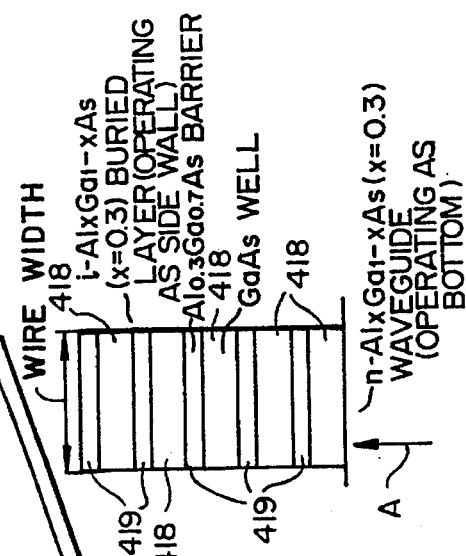

METHOD OF PRODUCING A LASER DEVICE

BACKGROUND OF THE INVENTION AND RELATED ART STATEMENT

The present invention relates to a method for producing a semiconductor microstructure.

In a prior-art method as disclosed by Applied Physics Letters 55 (26) (1989) pp. 2715–2717, a GaAs V-shaped laminated microstructure is formed over a substrate surface with a V-shaped groove through a MOCVD (Metal Organic Chemical Vapor Deposition) process, and each of V-shaped layers extends continuously from the V-shaped groove to an outside thereof so that a width of each of V-shaped layers is not limited by the V-shaped groove.

OBJECT AND SUMMARY OF THE INVENTION

An object of the present invention is to provide a method for producing a semiconductor microstructure, by which method a width of a semiconductor element is correctly defined. This method is particularly preferable for forming a semiconductor quantum dot or wire surrounded by a semiconductor-barrier or electrically-insulating side wall.

According to the present invention, a method for forming a semiconductor microstructure, comprises the steps of:

forming a groove having a surface of a side wall and a surface of a bottom, and depositing a semiconductor layer in the groove so that a width of the semiconductor layer is defined by the surface of the side wall.

Since the semiconductor layer is deposited in the groove so that the width of at least a part of the semiconductor layer is defined by the surface of the side wall, the width of the semiconductor layer is correctly and securely limited. Therefore, the semiconductor layer with the correctly and securely limited width thereof can operate as an important element of a fine semiconductor electronic device.

When the semiconductor layer is substantially prevented from extending continuously from the surface of the side wall to an outside of the groove or from projecting continuously upward along the surface of the side wall from a body of the semiconductor layer toward the outside of the groove, or when a material of the semiconductor layer is substantially prevented from being deposited over the surface of the side wall, the whole of semiconductor layer is confined into the groove.

For preventing substantially the material of the semiconductor layer from being deposited over the surface of the side wall, that the semiconductor layer is deposited in the groove through a molecular beam epitaxy process, that the surface of the side wall extends substantially parallel to a molecular beam travelling direction of a molecular beam epitaxy for depositing the semiconductor layer, that a width of groove defined by the surface of the side wall expands toward the bottom in the molecular beam travelling direction of the molecular beam epitaxy, that a projection extends from the side wall in a direction substantially perpendicular to the molecular beam travelling direction so that an opening area of the groove extending along an imaginary face substantially perpendicular to the molecular beam travelling direction for receiving the molecular beam of the molecular beam epitaxy is decreased by the projection, that the side wall surface is prevented from extending along [111] crystal orientation face, that the surface of the side wall is exposed by an etching process, that after a layer is formed in the groove by an epitaxy process, the semiconductor layer is deposited on the layer in the groove through the molecular beam epitaxy process, that after the layer is formed in the groove by the molecular beam epitaxy process, the semiconductor layer is deposited on the layer in the groove through another molecular beam epitaxy process, that the surface of the side wall includes aluminum and/or oxide, that the surface of the side wall is formed of at least two layer surfaces whose materials is different from each other, and/or that a material of the bottom surface after the bottom surface is formed or exposed by the etching process before the semiconductor layer and/or the layer is deposited in the groove is different from a material of the side wall surface after the bottom surface is formed or exposed by the etching process before the semiconductor layer and/or the layer is deposited in the groove is preferable. For example, the material of the bottom surface before the deposition in the groove is preferably a GaAs compound, when the material of the side wall surface before the deposition in the groove is an AlGaAs compound.

At least a part of the side wall or the whole of the side wall may be removed after the semiconductor layer is deposited in the groove. The side wall may include an etching resistant mask layer part for defining a region of the side wall thereunder through the etching process, and the etching resistant mask layer part may be removed after the semiconductor layer is deposited in the groove. Another layer part may be arranged on the etching resistant mask layer part, and the etching resistant mask layer part and the another layer part may be removed after the semiconductor layer is deposited in the groove. The bottom may be formed through at least one of epitaxy and molecular beam epitaxy before the groove is formed. The side wall may include another semiconductor layer and/or an electrically insulating layer. The semiconductor layer may be made of a compound semiconductor.

After the surface of the bottom is exposed through an etching process, a first layer whose material is different from a material of the surface of the bottom is deposited through at least one of an epitaxy process and a molecular beam epitaxy process on the exposed surface of the bottom, the semiconductor layer may be deposited in the groove. In this case, a structure of the semiconductor electronic device is simplified. After the surface of the bottom is exposed through the etching process, the first layer whose material is substantially equal to the material of the surface of the bottom is deposited through at least one of the epitaxy process and the molecular beam epitaxy process on the exposed surface of the bottom, the semiconductor layer may be deposited in the groove. In this case, a crystal structure of the first layer is stable and constant on the surface of the bottom.

At least a part of the surface of the side wall may be covered by a layer before the semiconductor layer is deposited in the groove, and the layer may be removed to expose the at least a part of the surface of the side wall without being affected by depositing the semiconductor layer, after the semiconductor layer is deposited in the groove. In this case, the semiconductor layer is completely insulated from the outside of the groove by a space formed by removing the layer. At least a part of the side wall may be removed to expose a side of the semiconductor layer after the semiconductor layer is deposited in the groove. In this case, a barrier or insulating layer can cover continuously an upper surface and the side of the semiconductor layer after the part of the side wall is removed.

BRIEF DESCRIPTION OF THE DRAWINGS

FIG. 11 is a schematic view showing a semiconductor laser diode in which a laminated semiconductor device formed by another method according to the present invention is incorporated.

DETAILED DESCRIPTION OF PREFERRED EMBODIMENTS

Figure 1:
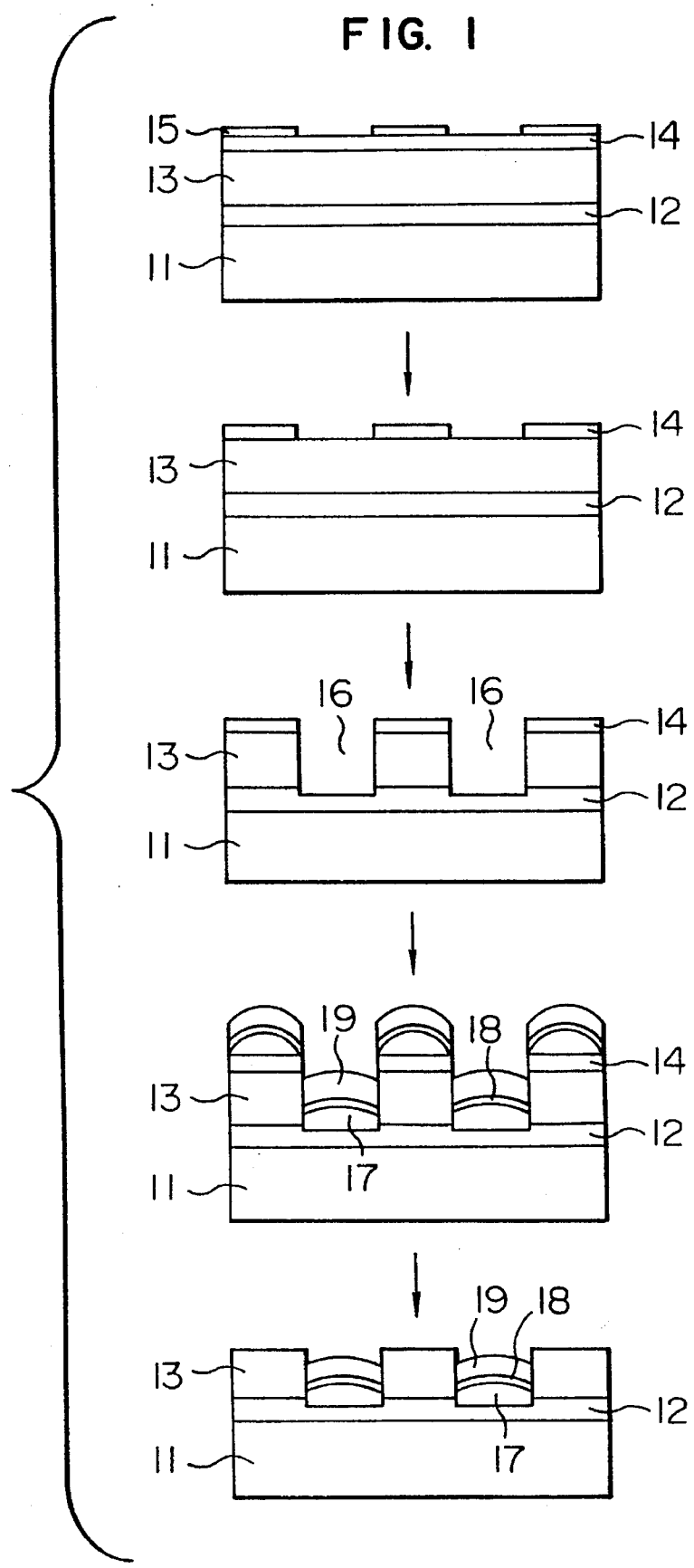
FIG. 1 includes schematic views showing steps of a method according to the present invention.

In a method as shown in FIG. 1, a GaAs buffer layer 12 of thickness 1 μm is formed-through an epitaxy process on a GaAs substrate 11 so that a GaAs purity and crystal structure correctness of the GaAs buffer layer 12 as a base of an $Al_{0.3}Ga_{0.7}As$ side wall layer 13 of thickness less than 100 nm and an $Al_{0.3}Ga_{0.7}As$ barrier layer 17 are improved. An etching resistant $SiO_2$ layer 14 of thickness 20 nm is formed over the $Al_{0.3}Ga_{0.7}As$ side wall layer 13, and subsequently is shaped into an etching resistant $SiO_2$ mask 14 under an etching resist pattern 15 through a hydrofluoric-acid type etching applied to the etching resistant $SiO_2$ layer 14. The resist pattern 15 with a width of 20 nm and stripe distance of 20 nm is formed through an electronic beam lithography process. Thereafter, the resist pattern 15 is removed.

A part of the $Al_{0.3}Ga_{0.7}As$ side wall layer 13 which is not covered by the etching resistant $SiO_2$ layer 14 is removed by a dry etching process or the like to form grooves 16 therein, until the grooves 16 reach the GaAs buffer layer 12. Due to the above-noted width and stripe distance of resist pattern 15, grooves 16 have substantially equal widths.

Thereafter, the $Al_{0.3}Ga_{0.7}As$ barrier layer 17 of thickness 50 nm, a GaAs quantum well layer 18 of thickness 10 nm and another $Al_{0.3}Ga_{0.7}As$ barrier layer 19 of thickness 50 nm are deposited on the GaAs buffer layer 12 in the grooves 16 that in order through a molecular beam epitaxy (MBE) process, so that the GaAs quantum well layer 18 as the claimed semiconductor layer surrounded by the $Al_{0.3}Ga_{0.7}As$ side wall layer 13 and the $Al_{0.3}Ga_{0.7}As$ barrier layers 17, 19 are formed. Before $Al_{0.3}Ga_{0.7}As$ barrier layer 17 is deposited into the grooves 16, another thin GaAs layer (not shown) may be deposited on the GaAs buffer layer 12 through the epitaxy process (for example, molecular beam epitaxy). Since a material of the another thin GaAs layer is equal to that of the GaAs buffer layer 12, a crystal structure of the another thin GaAs layer is stable, correct and constant on the GaAs buffer layer 12, although a part of the GaAs buffer layer 12 as the claimed surface of the bottom of the groove is formed or exposed by the etching.

The GaAs buffer layer 12 may be replaced by another $Al_{0.3}Ga_{0.7}As$ layer, a part of which, as the claimed surface of the bottom of the groove, is formed or exposed by the etching. In this case, the GaAs quantum well layer 18 may be directly deposited on the another $Al_{0.3}Ga_{0.7}As$ layer in the grooves 16 through the molecular beam epitaxy process. Alternatively, an additional thin $Al_{0.3}Ga_{0.7}As$ layer may be deposited on the another $Al_{0.3}Ga_{0.7}As$ layer in the grooves 16 through the epitaxy process (for example, molecular beam epitaxy), before the GaAs quantum well layer 18 is deposited into the grooves 16.

The etching resistant $SiO_2$ mask 14 with deposited portions corresponding to the $Al_{0.3}Ga_{0.7}As$ barrier layer 17, the GaAs quantum well layer 18 and the another $Al_{0.3}Ga_{0.7}As$ barrier layer 19 thereon are etched by hydrofluoric-acid type etching to be removed.

The $Al_{0.3}Ga_{0.7}As$ material may be replaced by any of $AlX Ga1-X As$ ($0<X \leq 1$). The $Al_{0.3}Ga_{0.7}As$ barrier layer 17, the GaAs quantum well layer 18 and the another $Al_{0.3}Ga_{0.7}As$ barrier layer 19 are curved slightly upwardly in this embodiment, but they may extend straight in the grooves 16. If the side wall layer 13 forms a hole (not shown) instead of the groove 16, the GaAs quantum well layer 18 forms a quantum dot.

Figure 2:
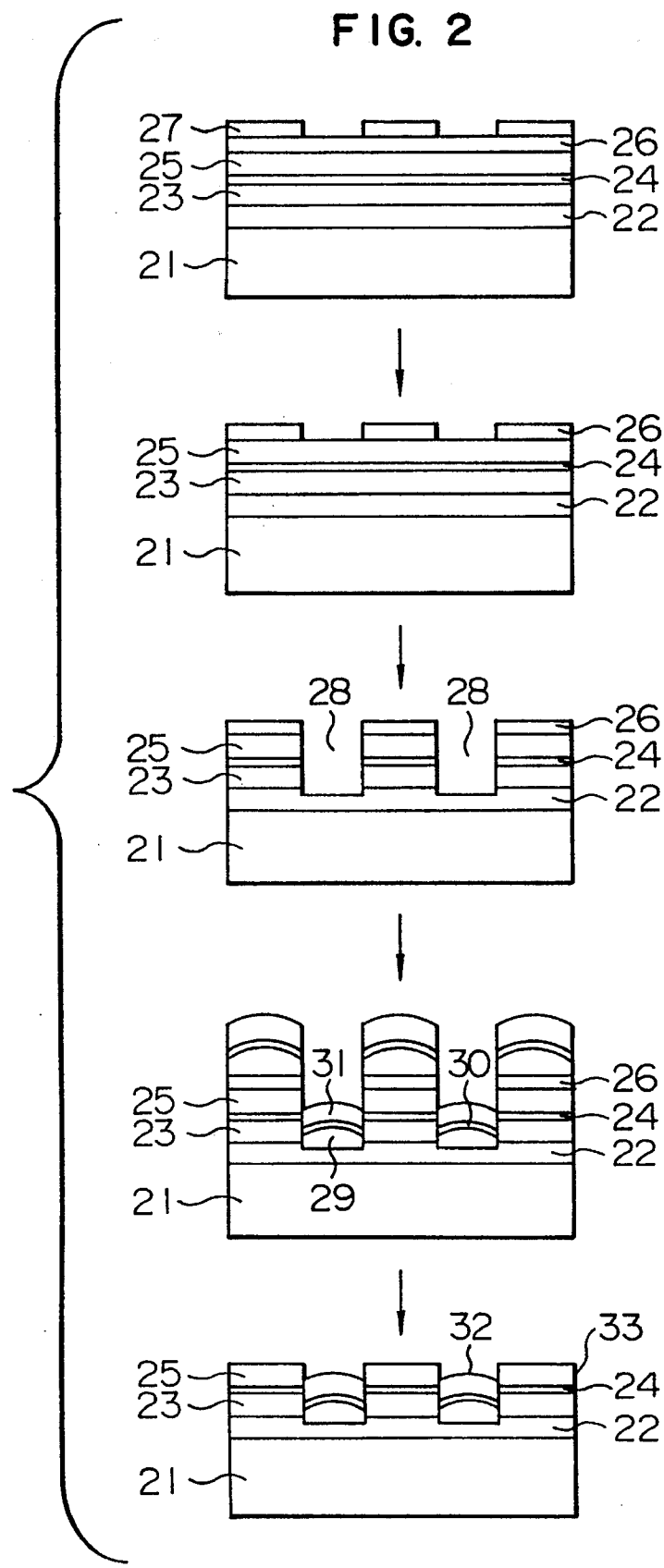
FIG. 2 includes schematic views showing steps of another method according to the present invention.

In another method as shown in FIG. 2, a GaAs buffer layer 22 of thickness 1 μm is formed through an epitaxy process on a GaAs substrate 21 so that a GaAs purity and crystal structure correctness of the GaAs buffer layer 22 as a base of an $Al_{0.3}Ga_{0.7}As$ side wall layer 23 of thickness less than 100 nm and an $Al_{0.3}Ga_{0.7}As$ barrier layer 29 are improved. A GaAs quantum well layer 24 of thickness 10 nm and another $Al_{0.3}Ga_{0.7}As$ side wall layer 25 of thickness less than 100 nm are formed in order on the $Al_{0.3}Ga_{0.7}As$ side wall layer 23. An etching resistant $SiO_2$ layer 26 of thickness 20 nm is formed over the $Al_{0.3}Ga_{0.7}As$ side wall layer 25, and subsequently is shaped into an etching resistant $SiO_2$ mask 26 under an etching resist pattern 27 through a hydrofluoric-acid type etching applied to the etching resistant $SiO_2$ layer 26. The resist pattern 27 with a width of 20 nm and stripe distance of 25 nm is formed on the etching resistant $SiO_2$ layer 26 through an electronic beam lithography process. Thereafter, the resist pattern 27 is removed.

A part of each of the $Al_{0.3}Ga_{0.7}As$ side wall layer 23, the GaAs quantum well layer 24 and the $Al_{0.3}Ga_{0.7}As$ side wall layer 25 which is not covered by the etching resistant $SiO_2$ mask 26 is removed by the dry etching process or the like to form grooves 28 therein, until the grooves 28 reach the GaAs buffer layer 22.

Thereafter, the $Al_{0.3}Ga_{0.7}As$ barrier layer 29 of thickness 50 nm, a GaAs quantum well layer 30 of thickness 10 nm and another $Al_{0.3}Ga_{0.7}As$ barrier layer 31 of thickness 50 nm are deposited on the GaAs buffer layer 22 in the grooves 28 in that order through the molecular beam epitaxy (MBE) process, so that the GaAs quantum well layer 30, as the claimed semiconductor layer surrounded by the Al$_{0.3}$Ga$_{0.7}$As side wall layer 23, and the Al$_{0.3}$Ga$_{0.7}$As barrier layers 29, 31 are formed. Before Al$_{0.3}$Ga$_{0.7}$As barrier layer 29 is deposited into the grooves 28, another thin GaAs layer (not shown) may be deposited on the GaAs buffer layer 22 through the epitaxy process (for example, molecular beam epitaxy). Since a material of the another thin GaAs layer is equal to that of the GaAs buffer layer 22, a crystal structure of the another thin GaAs layer is stable, correct and constant on the GaAs buffer layer 22, although a part of the GaAs buffer layer 22 as the claimed surface of the bottom of the groove is formed or exposed by the etching.

The GaAs buffer layer 22 may be replaced by another Al$_{0.3}$Ga$_{0.7}$As layer, a part of which, as the claimed surface of the bottom of the groove, is formed or exposed by the etching. In this case, the GaAs quantum well layer 30 may be directly deposited on the another Al$_{0.3}$Ga$_{0.7}$As layer in the grooves 28 through the molecular beam epitaxy process. Alternatively, an additional thin Al$_{0.3}$Ga$_{0.7}$As layer may be deposited on the another Al$_{0.3}$Ga$_{0.7}$As layer in the grooves 28 through the epitaxy process (for example, molecular beam epitaxy), before the GaAs quantum well layer 30 is deposited into the grooves 28.

The etching resistant SiO$_2$ mask 26 with deposited portions corresponding to the Al$_{0.3}$Ga$_{0.7}$As barrier layer 29, the GaAs quantum well layer 30 and the another Al$_{0.3}$Ga$_{0.7}$As barrier layer 31 thereon are etched by the hydrofluoric-acid type etching to be removed.

In this method, a semiconductor quantum wire device 32 with the GaAs quantum well layer 30 of width of 25 nm and another semiconductor quantum wire device 33 with the GaAs quantum well layer 24 of width of 20 nm are formed simultaneously. Therefore, a laser spectrum generated from a semiconductor laser diode device including the semiconductor quantum wire device 32 is different from a laser spectrum generated from a semiconductor laser diode device including the semiconductor quantum wire device 33.

A combination of a material of the buffer layer as the claimed bottom of the groove and a material of the side wall layer as the claimed side wall of the groove may be varied as follows.

| Side wall layer: AlGaAs | Buffer layer: GaAs |
| Side wall layer: AlAs | Buffer layer: GaAs |
| Side wall layer: AlAs | Buffer layer: AlGaAs |
| Side wall layer: AlGaInP | Buffer layer: GaInP |

Figure 3:
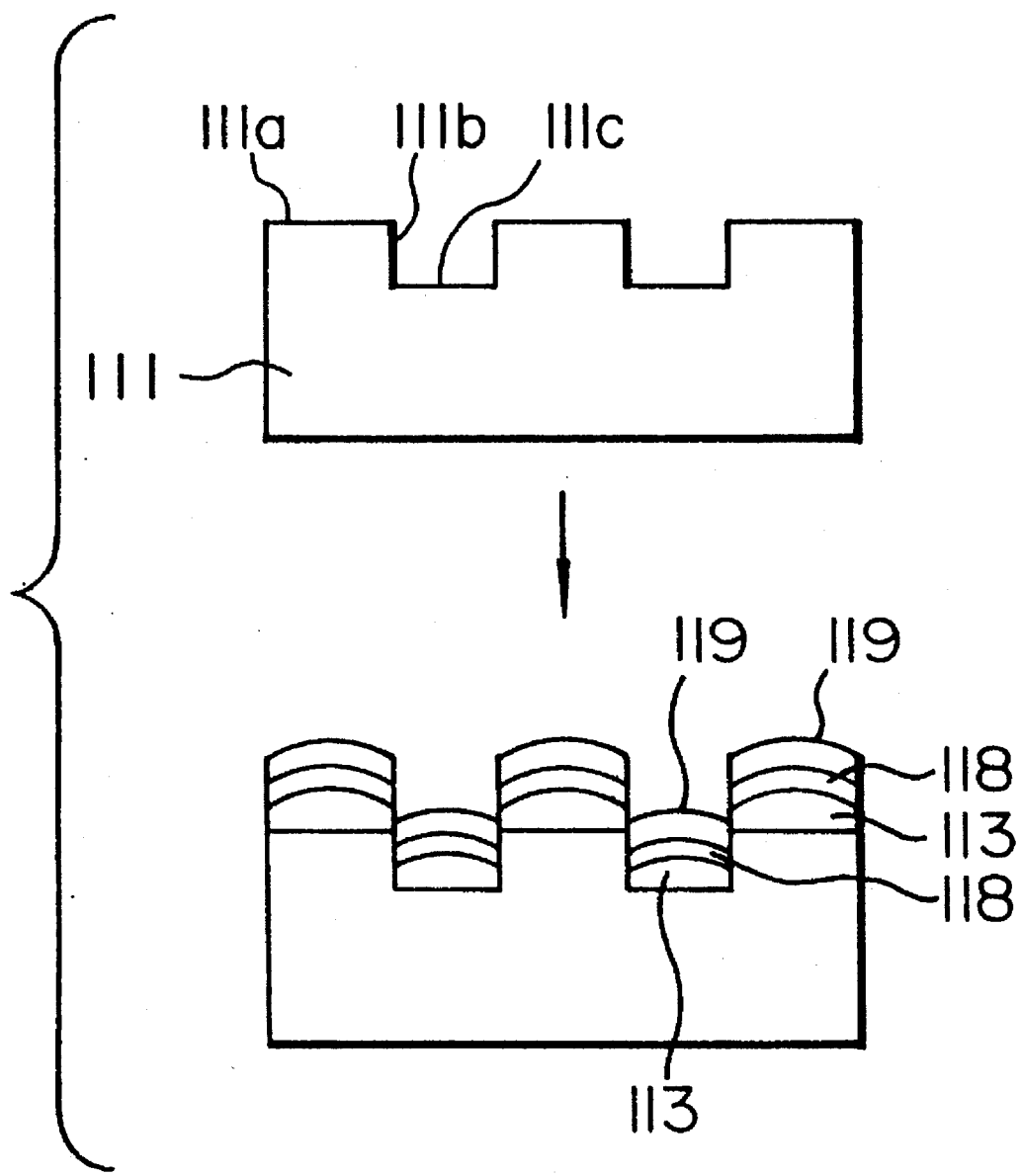
FIG. 3 includes schematic views showing steps of another method according to the present invention.

In a method as shown in FIG. 3, a first barrier layer 113, a quantum well layer 118 and a second barrier layer 119 are deposited in that order on a bottom surface 111c and upper surface 111a of a substrate 111, and a width of the quantum well layer 118 is limited by a side wall surface 111b. A width of the second barrier layer 119 is limited by both of the side wall surface 111b and the first barrier layer 113 on the upper surface 111a.

Figure 4:
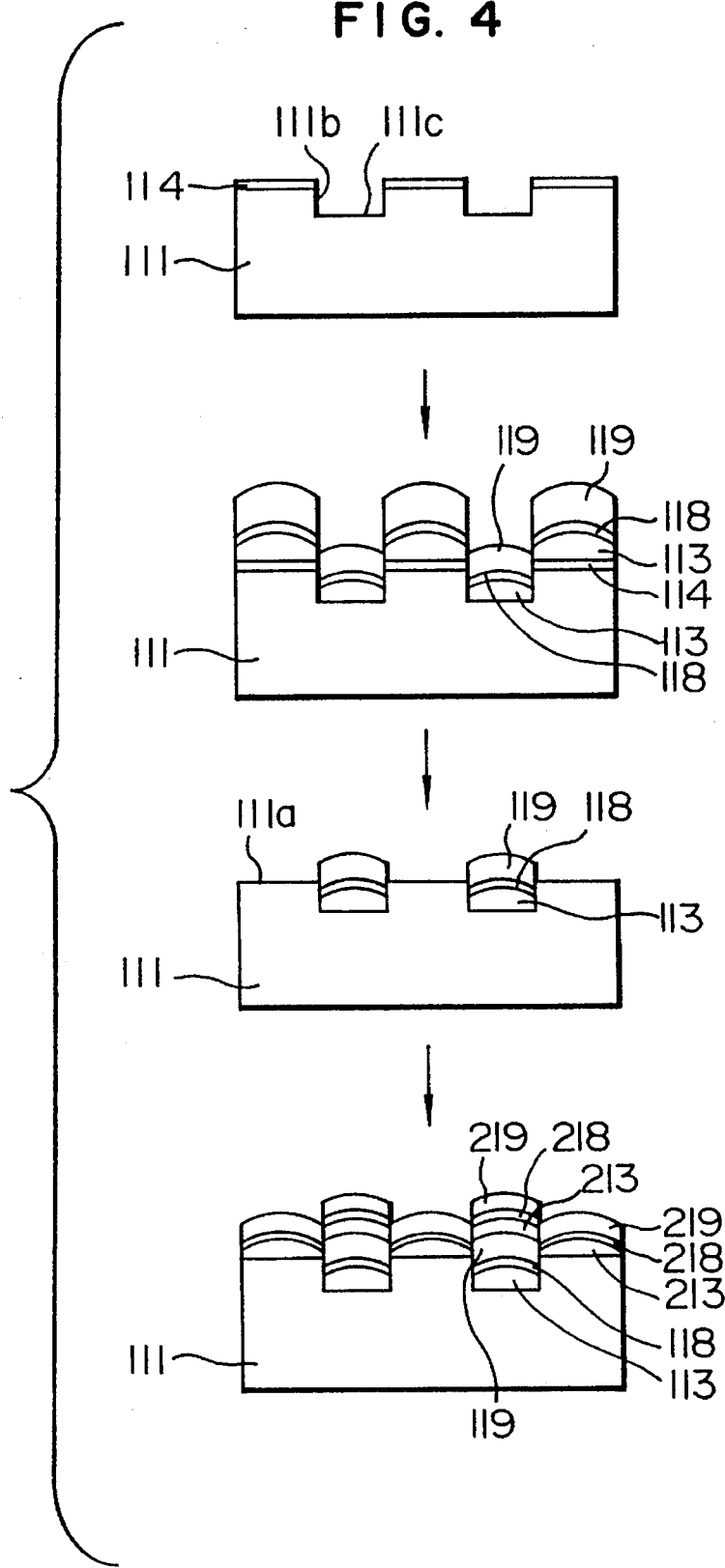
FIG. 4 includes schematic views showing steps of another method according to the present invention.

In a method as shown in FIG. 4, the first barrier layer 113, the quantum well layer 118 and the second barrier layer 119 are deposited in that order on the bottom surface 111c and an etching resistant SiO$_2$ mask 114 on the substrate 111, and the width of the quantum well layer 118 is limited by the side wall 111b. The width of the second barrier layer 119 is limited by the side wall surface 111b, the etching resistant SiO$_2$ mask 114 and the first barrier layer 113 on the etching resistant SiO$_2$ mask 114. Subsequently, the etching resistant SiO$_2$ mask 114 is etched to be removed from the substrate 111 together with the first barrier layer 113, the quantum well layer 118 and the second barrier layer 119 on the etching resistant SiO$_2$ mask 114 so that the upper surface 111a is exposed. Thereafter, a third barrier layer 213, a second quantum well layer 218 and a fourth barrier layer 219 are deposited in order on the second barrier layer 119 and the upper surface 111a, and the width of the quantum well layer 118 is limited by a side wall 111b. The width of the fourth barrier layer 219 on the upper surface 111a is limited by the second barrier layer 119, the third barrier layer 213 and the second quantum well layer 218, and a width of the quantum well layer 218 is limited by the second barrier layer 119.

Figure 5A:
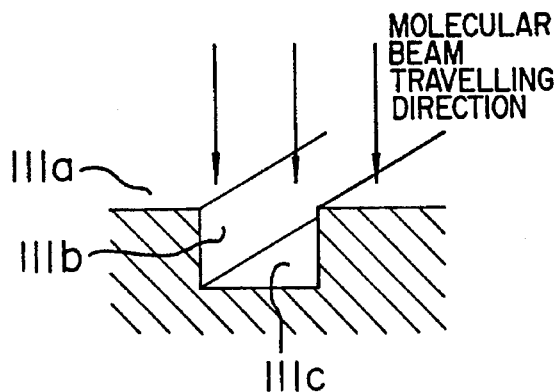
FIGS. 5A–5C are schematic cross-sectional views showing preferable shapes of grooves according to the present invention.
Figure 5B:
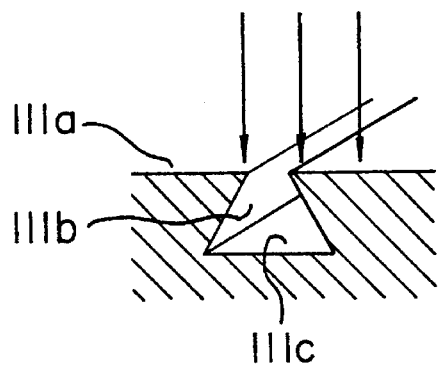
Figure 5C:
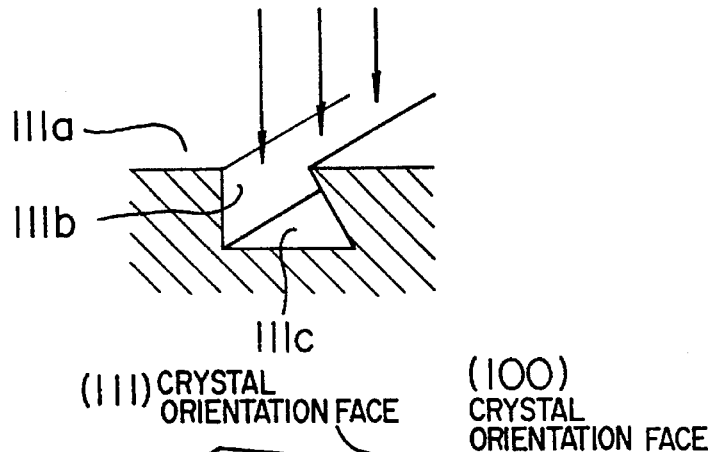

As shown in FIGS. 5A–5C, in order to prevent a material of the quantum well layer from being deposited onto the side wall surface 111b, it is preferable that the side wall surface 111b extends substantially parallel to a molecular beam travelling direction of the molecular beam epitaxy process, and/or that the side wall surface 111b extends obliquely to the molecular beam travelling direction in such a manner that the side wall surface 111b forms a reverse surface of the upper surface 111a receiving the molecular beam of the molecular beam epitaxy process, in other words, a cross-sectional area substantially perpendicular to the molecular beam travelling direction increases toward the bottom surface 111c in the molecular beam travelling direction.

Figure 6:
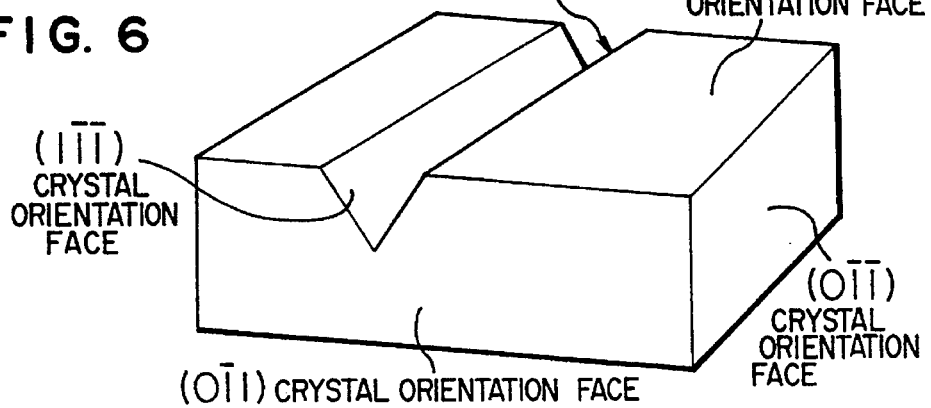
FIG. 6 is a schematic view showing an undesirable side wall surface extending along (111) crystal orientation face.

In order to prevent the material of the quantum well layer from being deposited onto the side wall surface 111b, it is preferable that the side wall surface 111b is prevented from extending along the (111) crystal orientation face of the material of the side wall as shown in FIG. 6.

Figure 7A:
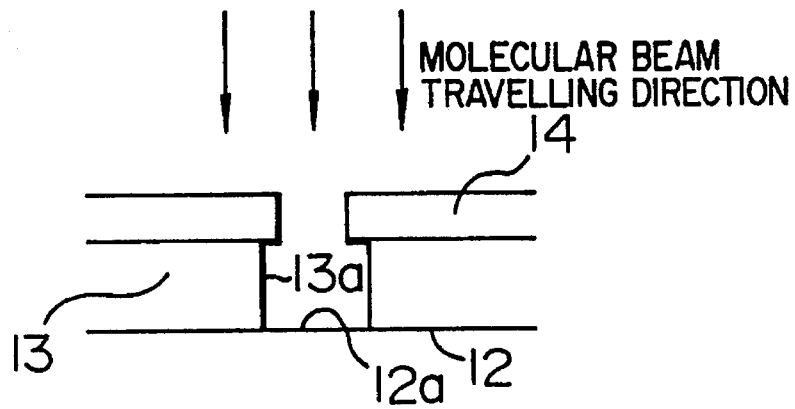
FIGS. 7A–7C are schematic cross-sectional views showing projections and preferable shapes of grooves according to the present invention.
Figure 7B:
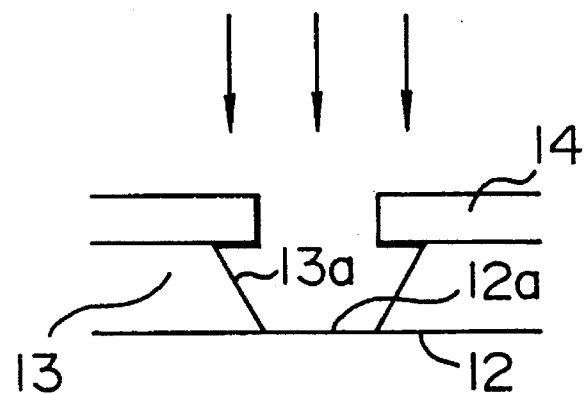
Figure 7C:
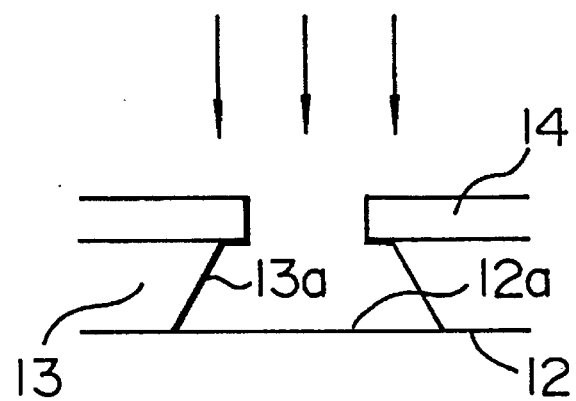

As shown in FIGS. 7A–7C, in order to prevent the material of the quantum well layer from being deposited onto the side wall surface 13a, it is preferable that a projection formed by, for example, the SiO$_2$ mask 14, extends substantially perpendicularly to the molecular beam travelling direction to decrease an opening or inlet area of the claimed groove for receiving the molecular beam so that the molecular beam is prevented at least partially from reaching the side wall surface 13a. Therefore, at least a part of the molecular beam reaches securely to the bottom surface 12a, and at least a part of the side wall 13a is prevented securely from being coated with the material of the quantum well layer.

Figure 8:
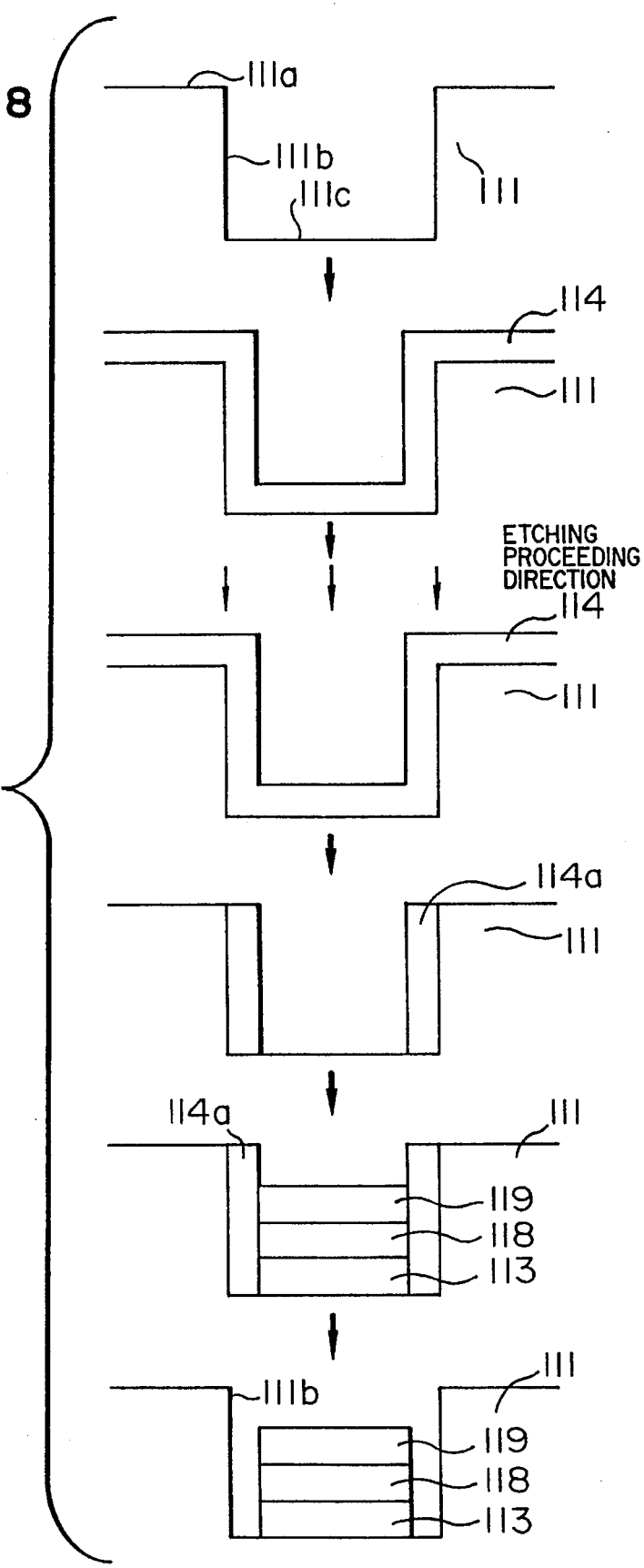
FIG. 8 includes schematic views showing steps of another method according to the present invention.

As shown in FIG. 8, after a quantum well layer 118 and barrier layers 113, 119 are deposited into the groove, a silicon-oxide or silicon-nitride coating layer 114a coated as a part of the side wall surface 111b may removed by the etching process so that the side wall surface 111b does not have the material of the quantum well layer thereon. The coating layer 114a is formed by forming a silicon-oxide or silicon-nitride layer 114 by, for example, a plasma chemical vapor deposition process, on the upper surface 111a, the side wall surface 111b and the bottom surface 111c, and removing parts of the layer 114 on the upper surface 111a and the bottom surface 111c by an anisotropic etching process.

Figure 9:
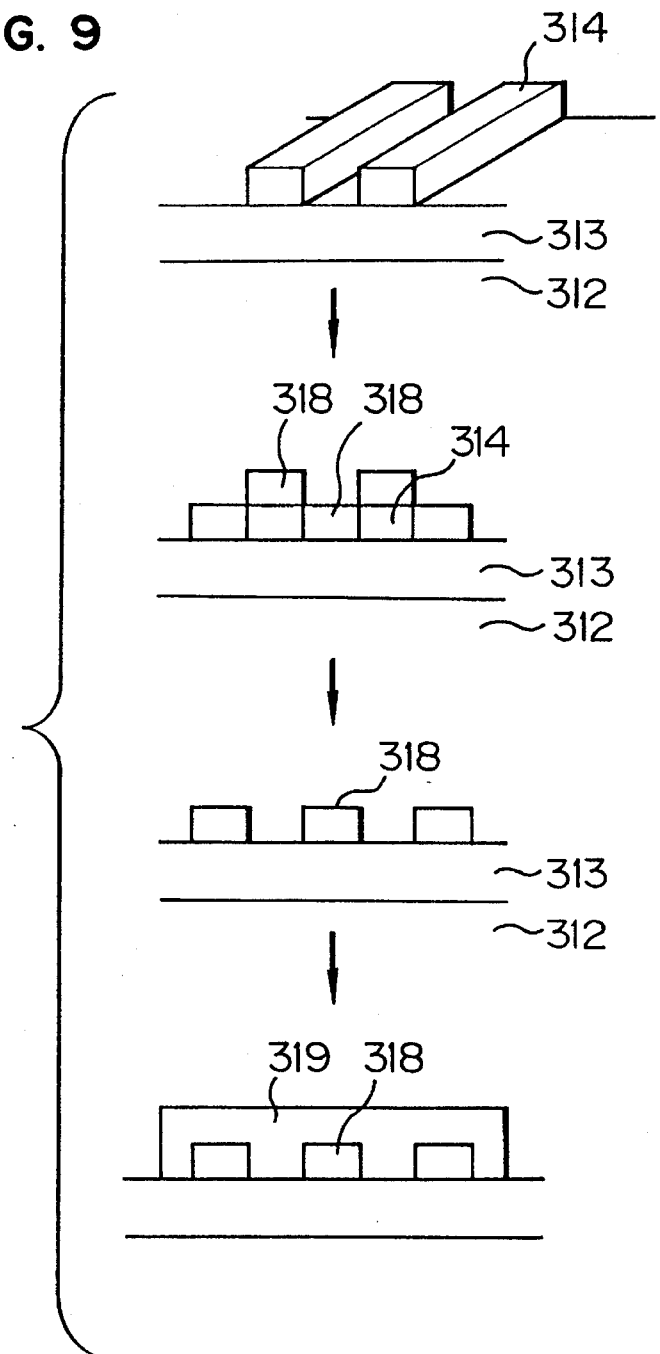
FIG. 9 includes schematic views showing steps of another method according to the present invention.

As shown in FIG. 9, quantum well layers 318 may be deposited in grooves formed by removable side walls 314 and a AlGaAs layer 313 on a GaAs substrate 312. After the quantum well layers 318 are deposited in the groove and on the side walls 314, the side walls 314 are removed by the etching process. Thereafter, the quantum well layers 318 are covered by a barrier layer 319.

Figure 10:
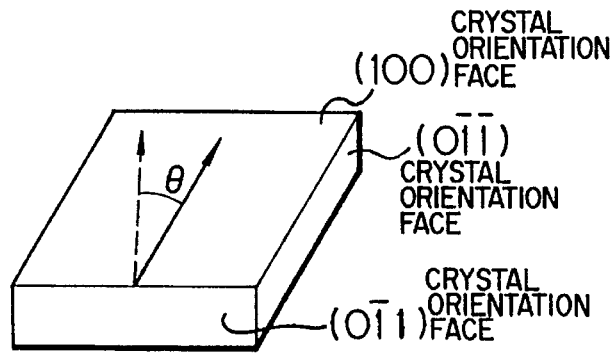
FIG. 10 is a schematic view showing a direction in which the groove extends, relative to crystal orientation faces of a substrate in which the groove is cut.

When the groove in which the quantum well layer is deposited extends in a direction with θ of zero relative to an arrow direction as shown in FIG. 10, the side wall surface 111b extends along the (111) crystal orientation face of the material of the side wall. When the groove in which the quantum well layer is deposited extends in another direction substantially perpendicular to the arrow direction, the side wall surface 111b extends as shown in FIG. 5B.

Figure 12:
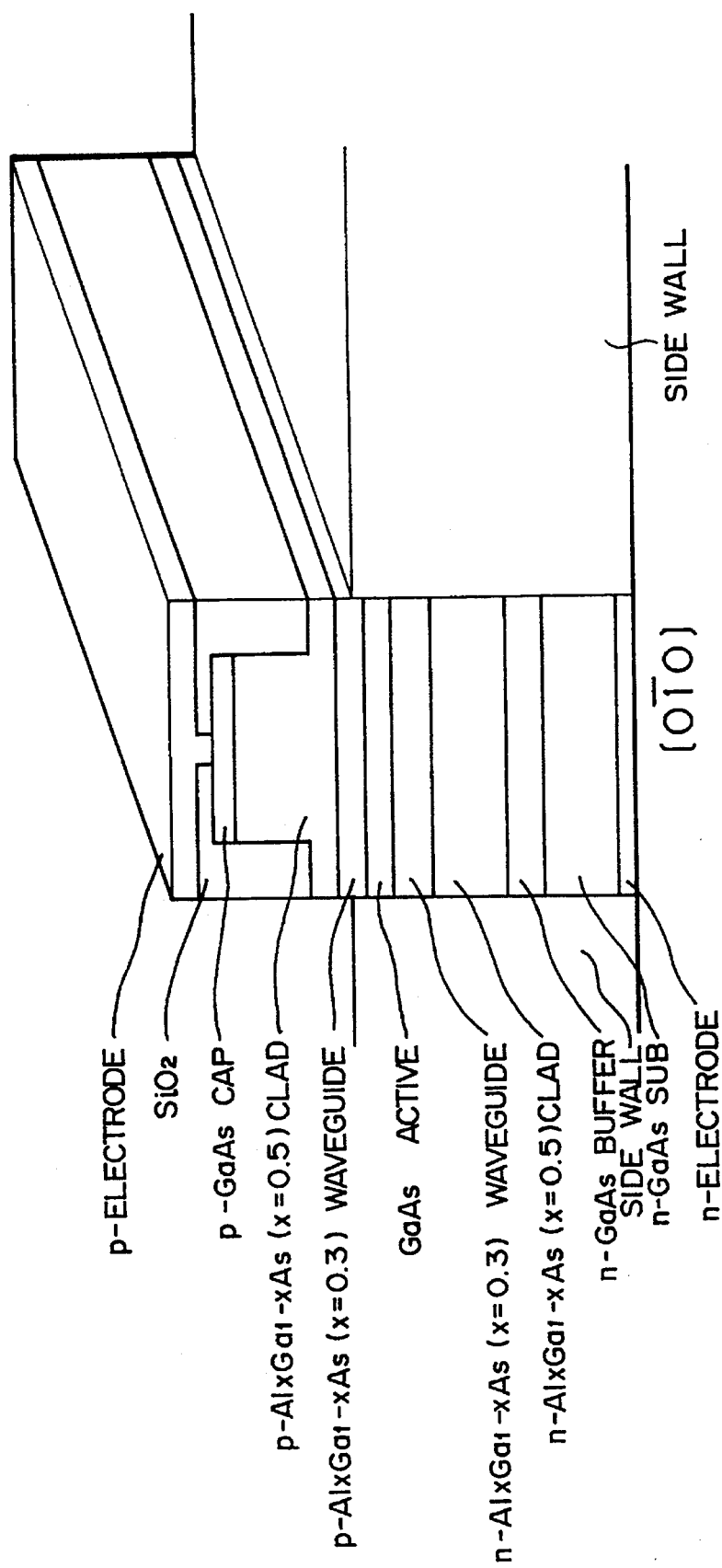
FIG. 12 is a schematic view showing another semiconductor laser diode in which another laminated semiconductor device formed by another method according to the present invention is incorporated.

As shown in FIG. 11, a combination of the side wall and the quantum well layer formed by the present invention may be incorporated in a semiconductor laser device. As shown in FIG. 11, quantum well layers 418 and barrier layers 419 are laminated in a laminating direction defined by arrow A. Also as shown, barrier layers 419 have substantially equal thicknesses and are not as thick as quantum well layers 418. Also as shown, waveguides 421 and 422 are thicker than the quantum well layers disposed in active layer 423, and grooves 416 have parallel side walls 413 extending substantially parallel to the deposition direction A. As shown, grooves 416 also extend substantially parallel to each other. As shown in FIG. 12, the semiconductor laser device including the quantum well layer may be formed in the groove including the side wall.

What is claimed is:

1. A method for producing a laser device including a first set of quantum-well layers disposed in an active layer that is disposed between waveguides, said method comprising the steps of:

(a) forming, in an active layer, a first groove, and
    (b) depositing a first set of quantum-well-layers in the first groove, said first groove being defined by parallel side walls extending substantially parallel to a deposition direction of the first get of quantum-well layers and said quantum-well layers of the first set of quantum-well layers having widths substantially equal to each other as determined by said parallel side walls.

2. A method according to claim 1, further comprising forming a barrier layer between the quantum-well layers of the first set of quantum-well layers.

3. A method according to claim 2, wherein a thickness, in the laminating direction of said first set of quantum-well layers, of the barrier layer is smaller than that of each of the quantum-well layers of the first set of quantum-well layers.

4. A method according to claim 1, wherein a thickness, in the deposition direction of said first set of quantum-well layers, of each of the waveguides is larger than that of each of the quantum-well layers of the first set of quantum-well layers.

5. A method according to claim 1, further comprising forming, in the active layer, simultaneously with said step (a), a second groove defined by parallel side walls and depositing a second set of quantum-well layers into said second groove, said side walls of the first and second grooves extending substantially parallel to each other.

6. A method according to claim 5, wherein a width of the second groove is substantially equal to that of the first groove.

7. A method according to claim 1, wherein thicknesses, in the deposition direction of said first set of quantum-well layers, of the quantum-well layers of the first set of quantum-well layers, are substantially equal to each other.

8. A method according to claim 1, further comprising forming barrier layers, in said first groove, interposed between the quantum-well layers of the first set of quantum-well layers, and wherein thicknesses, in the laminating direction of said first set of quantum-well layers, of the barrier layers are substantially equal to each other.

9. A method according to claim 1, wherein the quantum-well layers of the first set of quantum-well layers are deposited in the first groove between the parallel side walls by an epitaxy process.

* * * * *